United States Patent
Le Roux et al.

(10) Patent No.: US 6,240,281 B1
(45) Date of Patent: May 29, 2001

(54) COMMAND PROTOCOL FOR CIRCUITS USED FOR RECEIVING MICROWAVE SIGNALS AND DEVICE IMPLEMENTING THE PROTOCOL

(75) Inventors: Pascal Le Roux, Saint-Aubin du Cormier; Marc Louchkoff, Aubagne; Laurence Piquet, St-Aubin d'Aubigné; Robert Triole, Montreuil sur Ille, all of (FR)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/097,546

(22) Filed: Jun. 15, 1998

(30) Foreign Application Priority Data

Jun. 17, 1997 (FR) .................................................. 97 07492

(51) Int. Cl.[7] ................................ H04B 1/18; H04N 5/50
(52) U.S. Cl. ...................... 455/193.1; 455/280; 455/290; 348/731
(58) Field of Search ............................ 455/188.1, 184.1, 455/193.1, 195.1, 280, 290, 338, 3.1, 3.2, 3.3, 6.1, 6.2, 130, 131; 348/10, 11, 558, 705, 731

(56) References Cited

U.S. PATENT DOCUMENTS

| | | | |
|---|---|---|---|
| 4,393,277 | | 7/1983 | Besen et al. ........................... 179/2 A |
| 4,592,093 | * | 5/1986 | Ouchi et al. ........................... 455/3.2 |
| 4,608,710 | * | 8/1986 | Sugiura ................................... 455/3.2 |
| 4,965,825 | * | 10/1990 | Harvey et al. ......................... 380/233 |
| 5,027,430 | * | 6/1991 | Yamauchi et al. .................. 455/188.1 |
| 5,263,182 | * | 11/1993 | Park ..................................... 455/188.1 |
| 5,280,636 | * | 1/1994 | Kelley et al. ........................... 455/131 |
| 5,303,403 | * | 4/1994 | Leong ................................. 455/192.3 |
| 5,335,277 | * | 8/1994 | Harvey et al. ......................... 380/242 |
| 5,345,591 | * | 9/1994 | Tsurumaki et al. .................... 455/3.2 |
| 5,649,311 | * | 7/1997 | Somei ................................. 455/188.1 |
| 5,649,318 | * | 7/1997 | Lusignan ................................ 455/3.2 |
| 5,940,737 | * | 8/1999 | Eastman ................................ 455/3.2 |
| 5,956,620 | * | 9/1999 | Lazaris-Brunner et al. ......... 455/12.1 |

FOREIGN PATENT DOCUMENTS

0505038A1    9/1992  (EP) ................................ H04N/5/44

OTHER PUBLICATIONS

IT–U Q.23, General Recommendations on Telephone Switching and signalling, copyright ITU 1988.
Digital Satellite Equipment Control (DiSEqC™), BUS Functional Specification, Version 4.1, Apr. 18, 1997.

* cited by examiner

Primary Examiner—Vivian Chang
Assistant Examiner—Charles N. Appiah
(74) Attorney, Agent, or Firm—Joseph S. Tripoli; Robert D. Shedd

(57) ABSTRACT

In order to select one or more microwave signals from among the signals which it receives, the reception device comprises switching circuits. The switching circuits are commanded by command signals.

According to the invention, a switching circuit command signal consists of at least two sinusoidal signals generated according to the principle of voice-frequency dialling.

The invention applies more particularly to the reception of signals from telecommunication and/or telebroadcast satellites.

10 Claims, 2 Drawing Sheets

COMMAND PROTOCOL FOR CIRCUITS USED FOR RECEIVING MICROWAVE SIGNALS AND DEVICE IMPLEMENTING THE PROTOCOL

FIELD OF THE INVENTION

The present invention relates to a command protocol for circuits. More particularly, the invention relates to a command protocol for circuits used for receiving microwave signals such as, for example, the signals from telecommunication and/or telebroadcast satellites.

BACKGROUND OF THE INVENTION

By way of examples, the circuits commanded by the command protocol according to the invention can be switching devices or else motors of motorized antennas.

As is known to those skilled in the art, the electromagnetic waves emitted by a telecommunication and/or telebroadcast satellite are horizontally or vertically polarized microwaves whose frequencies lie within a high-frequency band or within a low-frequency band.

At the receiving end, the signal transported at microwave frequency by one or other of the two abovementioned polarizations is transposed into the satellite intermediate band by means of local oscillators located in low-noise conversion blocks which will subsequently be denoted LNB (standing for Low Noise Block).

The satellite intermediate band, generally denoted SIB, covers the frequencies lying between 950 MHz and 2150 MHz. It is subdivided into two sub-bands generally termed the low band and the high band. The low band covers the frequency range lying between 950 MHz and 1950 MHz and the high band covers the frequency range lying between 1100 MHz and 2150 MHz.

A command protocol allows the reception devices to select the polarization of the wave as well as the frequency band which it is desired to receive.

In the case of the satellite telecommunication system known by those skilled in the art as the ASTRA system, the reception device consists of a receiving antenna, an LNB block and a decoder.

The receiving antenna makes it possible to gather the microwaves originating from telecommunication and/or telebroadcast satellites.

The LNB block makes it possible to amplify the microwaves received, to select their polarization and their frequency band and to transpose them into intermediate frequency signals within the SIB band.

The decoder demodulates the intermediate frequency signal from the LNB block in order to generate the video signal which it contains.

The function of the decoder is also to transmit various cues to the LNB block allowing the latter to operate correctly and, especially, to carry out the wave polarization selection function and the frequency band selection function. The cues transmitted from the decoder to the LNB block are generally transmitted by the same transmission device as that which transmits the intermediate frequency signal from the LNB block to the decoder.

The function for selecting the polarization of the wave is performed by varying a supply voltage output by the decoder.

A first switching device located in the LNB block makes it possible to command the choice of the polarization of the wave with the aid of a command voltage from the decoder.

For a command voltage value of between 12.5 V and 14 V the switching device selects the vertically polarized wave and for a command voltage value of between 17 V and 19 V, the switching device selects the horizontally polarized wave.

The function for selecting the frequency band is performed with the aid of a periodic signal output by the decoder and whose frequency $f_c$ is equal to 22 kHz. To this end, a second switching device located in the LNB block makes it possible to command the choice of the frequency band with the aid of the periodic signal of frequency $f_c$ which it receives.

In the absence of the signal of frequency $f_c$, the switching device selects the low-frequency band and in the presence of the signal of frequency $f_c$, the switching device selects the high-frequency band.

The ASTRA telecommunication system relates more particularly to the reception of signals by a single reception device.

If it is desired to construct complex installations such as, for example, installations allowing multi-reception (N satellites/M reception devices) new variables must be defined in order to implement the command protocol.

Thus, in order to manage the commanding of complex systems, it has been proposed to introduce, into the signal reception devices, a control facility commonly referred to as a DiSEqC and which will subsequently be referred to as a DiSEqC system (the acronym DiSEqC standing for "Digital Satellite Equipment Control").

The specifications relating to the DiSEqC system are described in the document "Digital Satellite Equipment Control (DiSEqC™) BUS FUNCTIONAL SPECIFICATION Version 4.1" published on Feb. 6, 1997 by the European organization for satellite telecommunications.

The DiSEqC system makes it possible to generate cues in the form of "0"s and "1"s, each "0" or "1" being constructed with the aid of the abovementioned 22 kHz frequency signal.

Messages, consisting of combinations of "0"s and of "1"s are then used as parameters of the abovementioned command control protocol.

A command protocol using such a type of message has the drawback of being particularly slow.

By way of example, a switching device operating according to the DiSEqC mode makes it possible to switch from a first LNB to a second LNB in around 260 ms.

Such a control procedure duration is not compatible with the durations required, for example, by the programme broadcasters who prescribe a lock-on time for the functions of frequency conversion of the tuners and demodulation of the circuits located in the decoders of less than or equal to 100 ms.

Thus, according to the prior art, the management of complex installations proves to be virtually impossible in the time required.

The invention does not have this drawback.

SUMMARY OF THE INVENTION

Thus, the invention relates to a command protocol for circuits intended to select the reception of at least one signal from among a set of microwave signals. The command protocol comprises a step for generating at least one command signal emanating from a cue consisting of at least two sinusoidal signals generated according to the principle of voice-frequency dialling.

The principle of voice-frequency dialing is known within the field of telephony and is described in recommendation Q.23 contained in the blue book, volume 6, paragraph 6.1, entitled "General recommendations relating to telephone switching and signalling" published by the International Telecommunications Union.

The invention also relates to a device for receiving microwave signals, the device comprising command means making it possible to select at least one signal from among the various signals which it receives. The command means comprise at least one receiver circuit making it possible to convert into a command signal the cue consisting of at least two sinusoidal signals generated according to the principle of voice-frequency dialing.

By way of non-limiting examples, the signal reception device according to the invention can comprise at least one motorized antenna and/or at least one LNB block and/or at least one frequency transposer.

The invention also relates to a decoder of signals originating from at least one microwave signal reception device, the decoder comprising means for generating at least one signal transmitted to the reception device and making it possible to select at least one signal from among the various signals which the reception device receives. The means for generating at least one signal transmitted to the reception device comprise at least one generator making it possible to generate at least one cue consisting of at least two sinusoidal signals generated according to the principle of voice-frequency dialing.

The invention further relates to a system consisting of at least one reception device for microwave signals, of at least one decoder of signals output by the reception device and of at least one transmission device located between the reception device and the decoder. The reception device is a reception device such as that mentioned above according to the invention and the decoder is a decoder such as that mentioned above according to the invention.

The voice-frequency dialing system is known within the field of telephony. This system consists in coding each of the 10 digits making it possible to key in a telephone number in the form of a pair of two sinusoidal signals. As is specified in recommendation Q.23 of the blue book mentioned above, this coding system has the code reference "2.(1/4)".

According to the "2.(1/4)" code, a first group of signals termed the "high frequency" group consists of 4 signals of respective frequencies 1209 Hz, 1336 Hz, 1477 Hz and 1633 Hz and a second group of signals termed the "low frequency" group consists of 4 signals of respective frequencies 697 Hz, 770 Hz, 852 Hz, 941 Hz.

The following table can then be constructed:

|        | 1209 Hz | 1336 Hz | 1477 Hz | 1633 Hz |
|--------|---------|---------|---------|---------|
| 697 Hz | 1       | 2       | 3       | A       |
| 770 Hz | 4       | 5       | 6       | B       |
| 852 Hz | 7       | 8       | 9       | C       |
| 941 Hz | *       | 0       | ≠       | D       |

Thus, for example, the digit 1 consists of the two signals of respective frequencies 697 Hz and 1209 Hz, the * button of the two signals of respective frequencies 941 Hz and 1209 Hz and the ≠ button of the two signals of respective frequencies 941 Hz and 1477 Hz.

According to the embodiment of the invention using the frequencies mentioned in the table above, a pair of signals consisting of a signal from the "high frequency" group and a signal from the "low frequency" group is used as the signal making it possible to generate a command signal for at least one reception device switching device per satellite. According to this embodiment, it is then possible to generate 16 distinct command signals for a switching device.

The invention also relates to the case where the "high frequency" group consists of a number a1 of signals and the "low frequency" group of a number a2 of signals, a1 and a2 being two identical or different integers not necessarily equal to 4.

More generally, the invention also relates to the case in which the signal allowing the command of at least one switching device consists of a signal itself consisting of the combination of a number of sinusoidal signals greater than or equal to 2. Each of the sinusoidal signals participating in one and the same combination of signals then comes from a specific group of sinusoidal signals, the frequencies of the various sinusoidal signals of the various groups being in accordance with the abovementioned dialling principle.

An advantage of the invention is that it considerably reduces the time taken by a microwave signal reception system to select one signal from among all the signals received.

BRIEF DESCRIPTION OF THE DRAWINGS

Other characteristics and advantages of the invention will emerge on reading a preferred embodiment given with reference to FIGS. 1 and 2 in which.

In all the figures, the same reference numerals denote the same elements.

DESCRIPTION OF THE PREFERRED EMBODIMENTS

Figure 1:
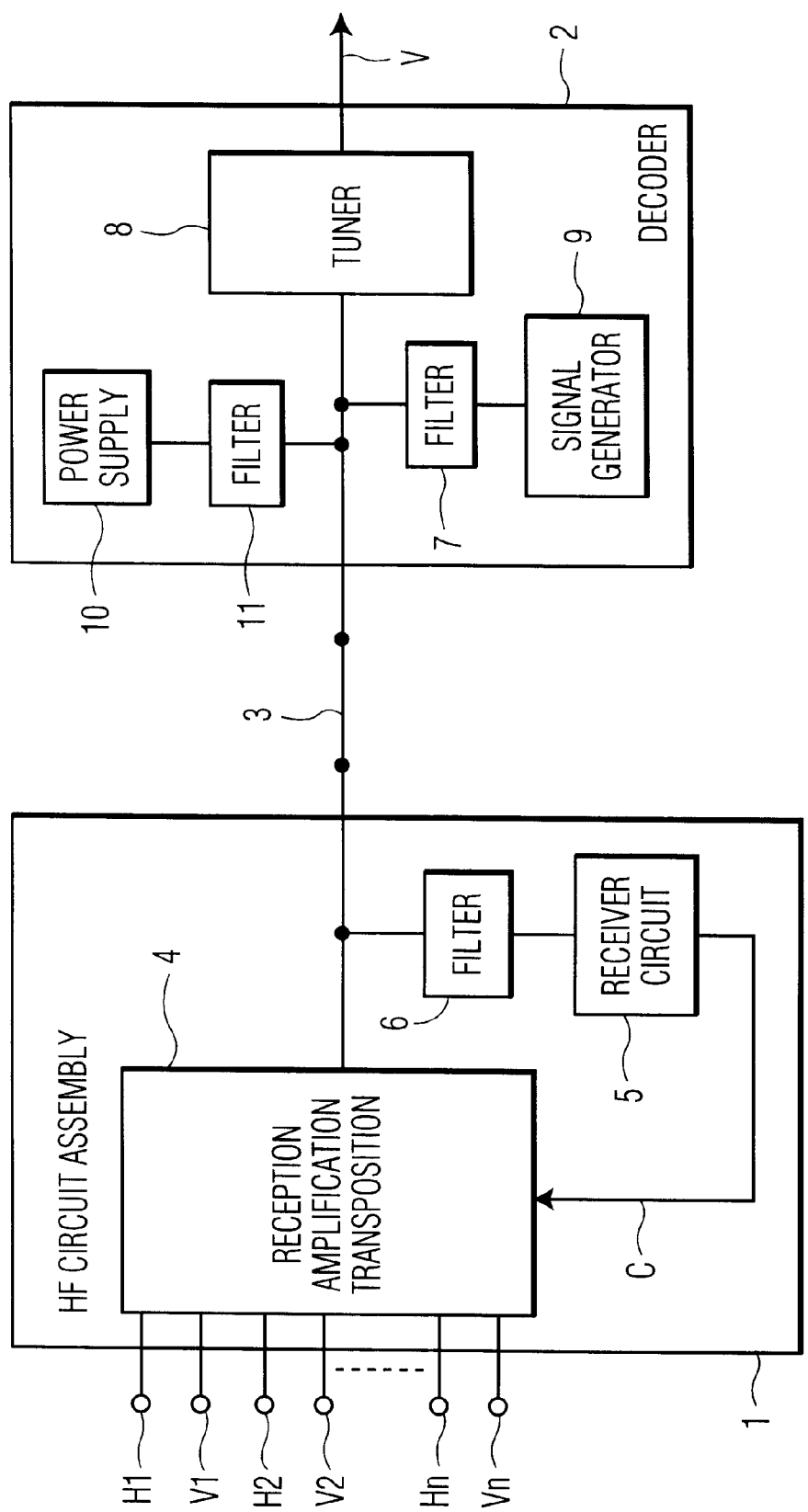
FIG. 1 represents a device for receiving microwave signals according to a first embodiment of the invention.

FIG. 1 represents a device for receiving microwave signals according to a first embodiment of the invention.

By way of non-limiting example, the device of FIG. 1 relates more particularly to a device for receiving signals from at least one telecommunication and/or telebroadcast satellite.

The reception device consists of an assembly 1 of high-frequency receiver circuits, a decoder 2 and a transmission element 3.

The transmission element 3 makes it possible to convey the selected signal output by the assembly 1 to the decoder 2 and the decoder 2 makes it possible to extract the video signal V from the selected signal which it receives.

The assembly 1 comprises a block 4 of high-frequency circuits making it possible to perform various operations such as, for example, the reception and/or amplification and/or transposition of at least one from among n microwave signals originating from various transmitting antennas, n being an integer greater than or equal to 1. The microwave signal of rank j (j=1, 2, . . . , n) consists of a horizontally polarized signal Hj and a vertically polarized signal Vj.

The decoder 2 comprises a frequency tuner 8 and a supply block 10.

According to the invention, the decoder 2 comprises a circuit 9 making it possible to generate sinusoidal signals according to the voice-frequency dialing principle and the assembly 1 of high-frequency circuits comprises a receiver circuit 5 making it possible to receive and decode the signals emitted by the circuit 9. The receiver circuit 5 generates command signals C making it possible to select at least one of the microwave signals received by the block 4. According to the embodiment of the invention using the frequencies contained in the abovementioned table, the number of distinct commands is equal to 16. The command C generated by the circuit 5 then consists of a message coded on 4 bits.

The assembly 1 comprises a filter 6 making it possible to isolate the receiver circuit 5 from the high-frequency signals output by the block 4 and transmitted to the decoder 2.

The decoder 2 comprises, on the one hand, a filter 7 making it possible to isolate the transmitter circuit 9 from the high-frequency signals which it receives from the block 4 and, on the other hand, a filter 11 making it possible to isolate the supply block 10 from the various sinusoidal signals present in the assembly 1 and in the decoder 2.

According to the principle of voice-frequency dialling, the frequencies of the signals making up the signal output by the circuit 9 are chosen so as not to permit interference either between the signals which they make up or between the signals which they make up and the signals output by the block 4.

By way of example, the frequencies of the signals making up the cue output by the circuit 9 lie between 300 Hz and 3400 Hz and the frequencies of the signals output by the block 4 lie between 950 MHz and 2150 MHz.

An advantage of the invention is that it uses command signals based on signals whose frequency is far from the frequency of 22 kHz which is used in the prior art reception systems. It follows that the reception system according to the invention is compatible with simultaneous use together with the prior art systems.

Another advantage of the invention is that there is no longer any need to convey the two above-mentioned command voltage values from the decoder 2 to the assembly 1 of receiver circuits. Only the voltage required for polarizing various circuits which make up the assembly 1 is conveyed from the decoder 2 to the assembly 1.

As mentioned earlier, an advantage of the invention is that it allows the commanding of the various switching circuits to be performed very rapidly.

According to the principle of voice-frequency dialling, a receiver circuit 5 needs to incorporate of the order of 10 periods of each of the two signals emitted by the circuit 9.

By way of example, in the most penalizing case in which the lowest frequency mentioned above, that is to say 697 Hz, figures among the frequencies used, the duration required for the cue received by the circuit 5 to be taken into account is of the order of 14 ms.

It is then possible, according to this example, to toggle a switch from a first LNB to a second LNB in a time of the order of 14 ms.

By way of comparison, as mentioned earlier, the toggling of a switch operating according to the DiSEqC mode is performed in around 260 ms.

According to the invention, the durations required for the toggling of various switching devices are short enough for it to be possible to stipulate a management of time within the command protocol. Thus, according to an improvement to the invention, the command signals are emitted only for the number of periods required in order for the receiver circuit to have time to incorporate them.

Figure 2:
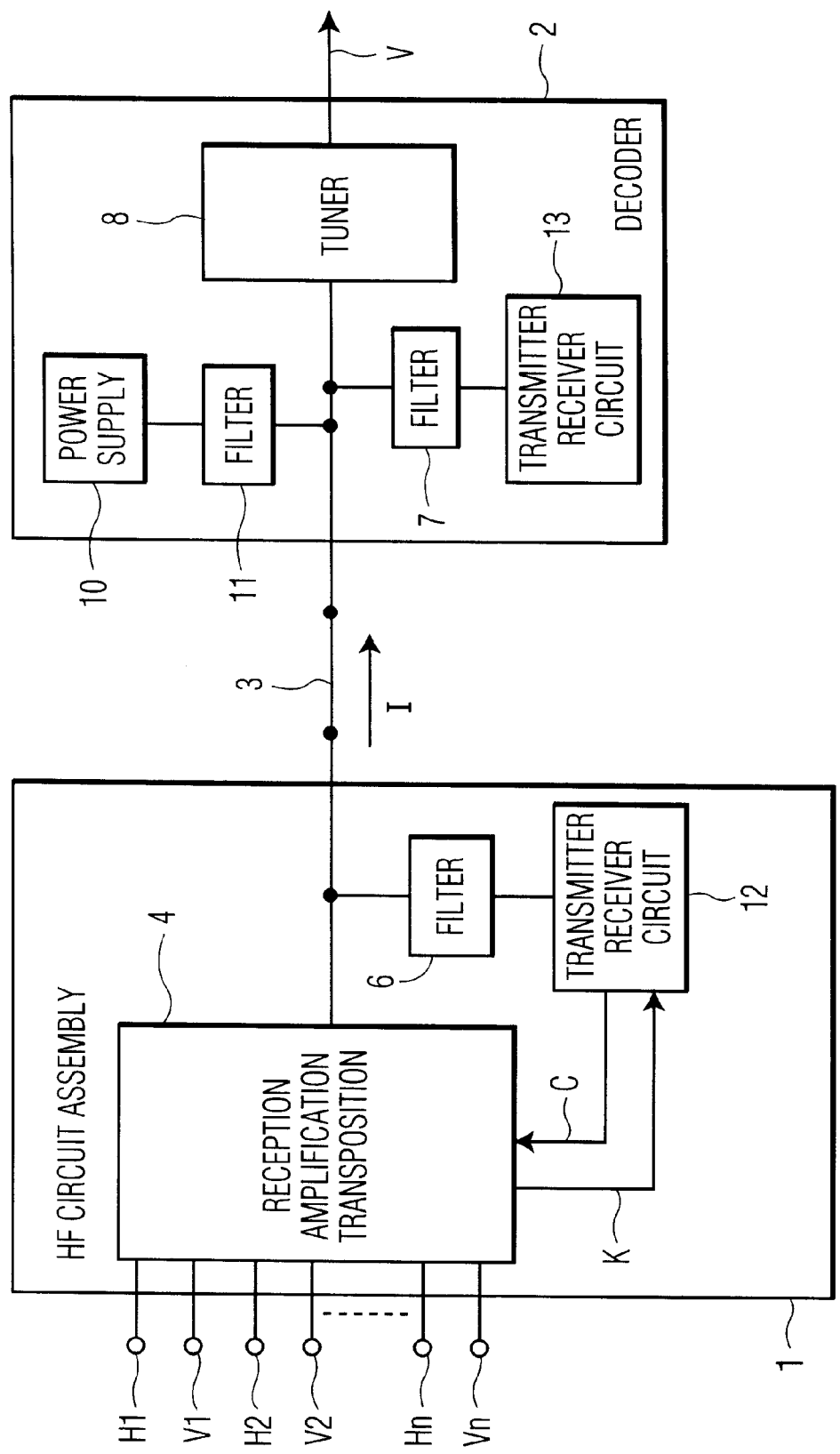
FIG. 2 represents a device for receiving microwave signals according to a second embodiment of the invention.

FIG. 2 represents a device for receiving microwave signals according to a second embodiment of the invention.

Like the device of FIG. 1, the device of FIG. 2 relates more particularly to a device for receiving signals from at least one telecommunication and/or telebroadcast satellite.

The embodiment of FIG. 2 represents a device for receiving signals able to use a dialogue mode between the assembly 1 and the decoder 2.

To this end, the assembly 1 of receiver circuits comprises, in addition to the receiver circuit 5 mentioned above, a circuit emitting signals which comply with the principle of voice-frequency dialing so as to constitute a transmitter/receiver block 12. Likewise, the decoder 2 comprises, in addition to the abovementioned generator circuit 9, a circuit receiving signals complying with the principle of voice-frequency dialling so as to constitute a transmitter/receiver block 13.

This embodiment relates to the case in which cues have to be exchanged between the circuit block 4 and the decoder 2 so as to ensure optimization of the command C before being applied to at least one of the receiver circuits contained in the block 4.

By way of non-limiting example, this embodiment relates to the case of motorized antennas which are required to go from one orbital position to another. A cue K giving the absolute position of the antenna must then be returned to the decoder 2 so as to be able to adjust the command C for positioning the antenna. The cue K giving the absolute position of the antenna is then transmitted to the transmitter/receiver block 12 which codes it in the form of a cue I consisting of at least two sinusoidal signals complying with the principle of voice-frequency dialling. The cue I is transmitted from the transmitter/receiver block 12 to the transmitter/receiver block 13. The receiver of the transmitter/receiver block 13 processes the cue which it receives.

Subsequent to the processing performed by the receiver of the transmitter/receiver block 13, the transmitter of the transmitter/receiver block 13 transmits a new command to the receiver of the transmitter/receiver block 12. The exchange of data between the transmitter/receiver 13 and the transmitter/receiver 12 continues until the command value C making it possible to obtain the desired result is obtained.

What is claimed is:

1. A signal reception system comprising:
    an input/output connection for connection to a high-frequency circuit assembly through a transmission element;
    a circuit for generating a combination of at least two sinusoidal signals, said circuit being connected to said input/output connection, wherein the combination of the respective frequencies of said sinusoidal signals is a function of a command signal for selecting one among a plurality of high-frequency signals received by said high-frequency circuit assembly and for transmission of said selected signal through said transmission element; and
    a tuner for receiving said selected signal.

2. The system according to claim 1, wherein said circuit for generating said sinusoidal signals generates a pair of sinusoidal signals according to a voice-frequency dialing scheme in which each possible value of the command signal is represented by a different combination of the respective frequencies.

3. The system according to claim 2, wherein said voice-frequency dialing system is that of ITU-T Q.23 recommendations.

4. The system according to claim 1, wherein said frequencies are chosen so as not to interfere with a 22 kHz signal.

5. The system according to claim 4, wherein said data item represents a parameter value of a motorized reception antenna connected to said high-frequency circuit assembly.

6. The system according to claim 5, further comprising a circuit for generating simultaneously at least two sinusoidal signals, said circuit being connected to said input/output connection, wherein the combination of the respective frequencies of said sinusoidal signals is a function of a data item.

7. The system according to claim 5, wherein said combination of frequencies is made according to a voice-frequency dialing scheme, in which each possible value of the command signal is represented by a different combination of the respective frequencies.

8. The system according to claim 1, further comprising a circuit for receiving and decoding a data item produced by said high-frequency circuit assembly and coded using at least two sinusoidal signals.

9. A signal reception system, comprising:

a plurality of high-frequency signal inputs;

a circuit for selecting one of said high-frequency signals in response to a command signal;

an input/output connection for transmitting said selected signal and for receiving a combination of a plurality of sinusoidal signal, wherein the combination of frequencies of the respective sinusoidal signals is representative of said command signal; and a receiver circuit, connected to said circuit for selecting, receiving and decoding said plurality of sinusoidal signals and for generating said command signal in response to said plurality of sinusoidal signals.

10. The system according to claim 9, wherein said data item is representative of a position of a motorized antenna connected to said assembly.

* * * * *